(12) United States Patent
Thaller

(10) Patent No.: US 7,675,373 B2
(45) Date of Patent: Mar. 9, 2010

(54) VOLTAGE CONTROLLED OSCILLATOR CIRCUIT AND A METHOD FOR CONFIGURING A VOLTAGE CONTROLLED OSCILLATOR CIRCUIT

(75) Inventor: Edwin Thaller, Faak am See (AT)

(73) Assignee: Infineon Technologies AG, Redmond, WA (US)

( * ) Notice: Subject to any disclaimer, the term of this patent is extended or adjusted under 35 U.S.C. 154(b) by 119 days.

(21) Appl. No.: 11/807,484

(22) Filed: May 29, 2007

(65) Prior Publication Data

US 2008/0297267 A1    Dec. 4, 2008

(51) Int. Cl.
    *H03B 27/00*    (2006.01)
(52) U.S. Cl. .................... 331/57; 331/36 C; 331/177 V; 331/117 R; 331/117 FE; 331/167
(58) Field of Classification Search ................. 331/167, 331/57, 158, 117 R, 117 FE, 36 C, 177 V
See application file for complete search history.

(56) References Cited

U.S. PATENT DOCUMENTS

| | | | |
|---|---|---|---|
| 6,906,596 B2 * | 6/2005 | Kitamura et al. | 331/36 C |
| 7,102,454 B2 * | 9/2006 | Sze et al. | 331/117 FE |
| 2002/0171499 A1 | 11/2002 | Momtaz et al. | |
| 2005/0231240 A1 * | 10/2005 | Goldfarb et al. | 327/105 |
| 2006/0097797 A1 | 5/2006 | Gomez | |
| 2006/0145767 A1 | 7/2006 | Vaanenen | |
| 2006/0145769 A1 | 7/2006 | Vaananen et al. | |

FOREIGN PATENT DOCUMENTS

WO    WO 2005/081406 A1    9/2005

OTHER PUBLICATIONS

Da Dalt, Nicola, et al. "A Compact Triple-Band Low-Jitter Digital *LC* PLL With Programmable Coil in 130-nm CMOS." *IEEE Journal of Solid-State Circuits*. vol. 40, No. 7. Jul. 2005. p. 1482-1490. (9 Pages).

Berny, Axel D., et al. "A 1.8-GHz *LC* VCO With 1.3-GHz Tuning Range and Digital Amplitude Calibration." *IEEE Journal of Solid-State Circuits*. vol. 40, No. 4. Apr. 2005. p. 909-917). (9 Pages).

Staszewski, Robert Bogdan, et al. "Digitally Controlled Oscillator (DCO)-Based Architecture for RF Frequency Synthesis in a Deep-Submicrometer CMOS Process." *IEEE Transactions on Circuits and System-II: Analog and Digital Signal Processing*. vol. 50, No. 11. Nov. 2003. p. 815-828. (14 Pages).

* cited by examiner

*Primary Examiner*—Arnold Kinkead
(74) *Attorney, Agent, or Firm*—Lee & Hayes, PLLC

(57) ABSTRACT

The voltage controlled oscillator (VCO) circuit comprises a tank circuit, a first tuning section comprising first capacitor elements wherein each one of the first capacitor elements is individually utilizable for the tank circuit, and a second tuning section comprising second capacitor elements wherein each one of the second capacitor elements is individually utilizable for the tank circuit and the capacitance of each one of the second capacitor elements is continuously adjustable in a predetermined capacitance range in dependence on a tuning voltage.

21 Claims, 7 Drawing Sheets

DETERMINING CONFIGURATION FOR MINIMUM VARIATION OF VCO GAIN

Fig. 6a

DETERMINING CONFIGURATION FOR MAXIMUM VCO GAIN

Fig. 6b

VOLTAGE CONTROLLED OSCILLATOR CIRCUIT AND A METHOD FOR CONFIGURING A VOLTAGE CONTROLLED OSCILLATOR CIRCUIT

BACKGROUND OF THE INVENTION

The present invention relates to a voltage controlled oscillator circuit and a method for configuring a voltage controlled oscillator circuit.

In a voltage controlled oscillator (VCO) circuit an output signal can be generated with a frequency that varies in response to an input control voltage. VCOs can be utilized in many circuit applications wherein many of them demand a wide output frequency range for the VCO. One example of a circuit application of a VCO is a phase-locked loop (PLL) which is an important circuit block in data communication systems.

If a wide output frequency range of the VCO is desired, the VCO typically requires a large gain. The VCO gain, however, has the undesirable effect of amplifying any noise in the input voltage signal to the VCO, resulting in output signal jitter and adversely affects the overall performance of the phase-locked loop. It is thus in general advantageous to keep the VCO gain low.

In LC-tank based VCOs usually the oscillation frequency is tuned with voltage dependent capacitors, in particular NMOS or PMOS varactors. To achieve a low VCO gain and still a large tuning range of the VCO, the total tuning range can be divided into several possibly overlapping sub-ranges by using varactors for continued fine tuning and an arrangement of switched varactors or capacitors for coarse frequency selection.

In such a configuration, however, the VCO gain is different for different tuning curves. The reason is that with an increasing number of coarse tuning varactors switched on, the VCO gain gets lower since the relative capacity of the fine tuning varactors compared to the total tank capacity decreases. If such a VCO is utilized in a phase-locked loop, the change of the VCO gain would result in an unwanted change of the PLL bandwidth.

BRIEF DESCRIPTION OF THE SEVERAL VIEWS OF THE DRAWINGS

Aspects of the invention are made more evident in the following detailed description of some embodiments when read in conjunction with the attached drawing figures, wherein:

FIG. 6a shows a diagram of an embodiment of a method for configuring a voltage controlled oscillator circuit;

FIG. 6b shows a diagram of a further embodiment of a method for configuring a voltage controlled oscillator circuit.

DETAILED DESCRIPTION OF THE INVENTION

Figure 1:
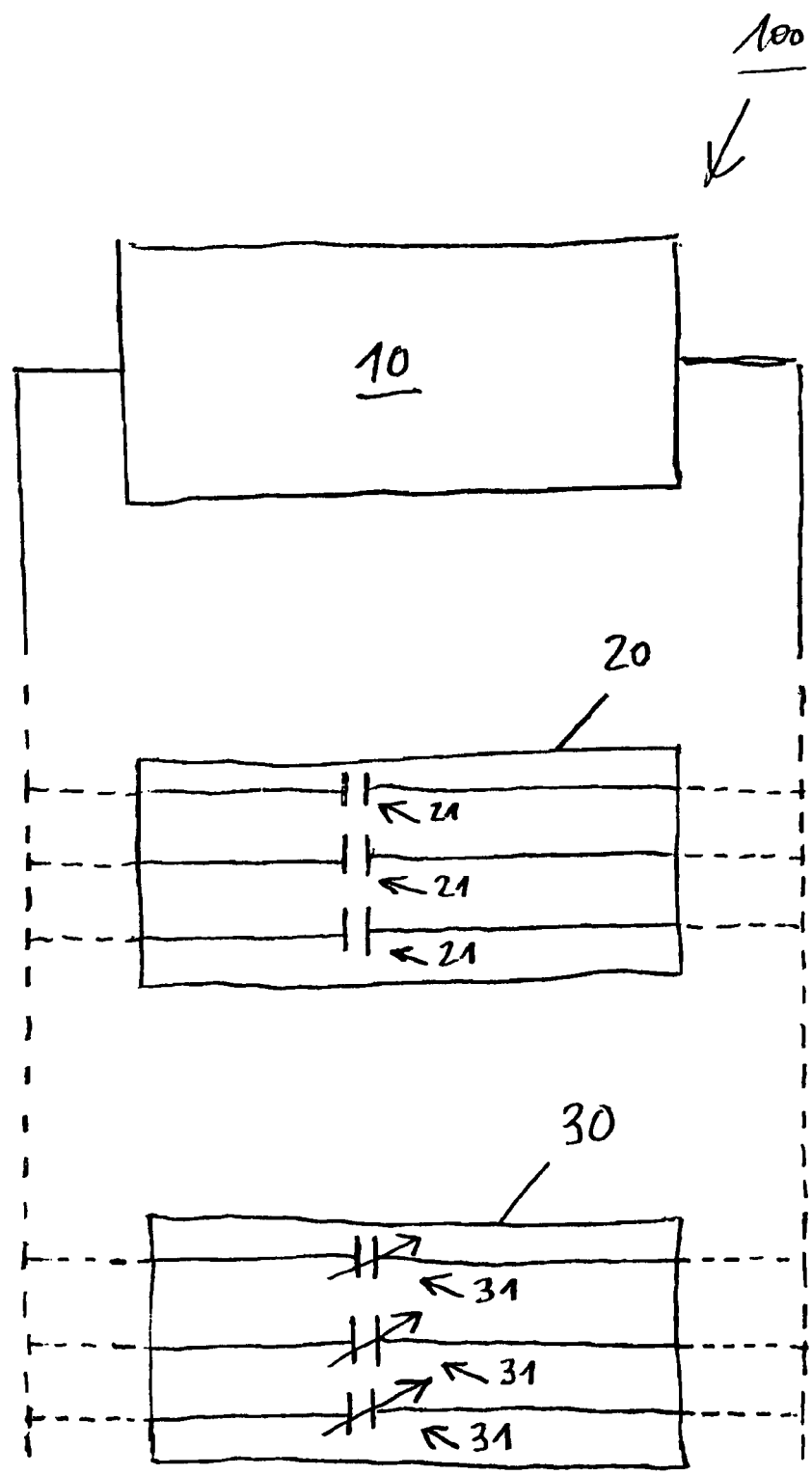
FIG. 1 shows a schematic representation of an embodiment of a voltage controlled oscillator circuit.

The aspects and embodiments of the invention are now described with reference to the drawings, wherein like reference numerals are generally utilized to refer to like elements throughout. In the following description, for purposes of explanation, specific details are set forth in order to provide a thorough understanding of one or more aspects of embodiments of the invention. It may be evident, however, to one skilled in the art that one or more aspects of the embodiments of the invention may be practiced with a lesser degree of the specific details. In other instances, known structures and devices are shown in block diagram form in order to facilitate describing one or more aspects of the embodiments of the invention. The following description is therefore not to be taken in a limiting sense, and the scope of the invention is defined by the appended claims.

Referring to FIG. 1, there is shown a schematic representation of an embodiment of a voltage controlled oscillator circuit 100 in the form of a block diagram. The voltage controlled oscillator (VCO) circuit 100 comprises a tank circuit 10, a first tuning section 20, and a second tuning section 30. The tank circuit 10 can be configured according to one embodiment as an LC-tank circuit comprising an inductor L and a capacitor C. The tank circuit 10 can also be configured according to a further embodiment as a ring oscillator circuit. The first tuning section 20 comprises first capacitor elements 21 wherein each one of the first capacitor elements 21 is individually utilizable for the tank circuit 10. The second tuning section 30 comprises second capacitor elements 31 wherein each one of the second capacitor elements 31 is individually utilizable for the tank circuit 10 and the capacitance of each one of the second capacitor elements 31 is continuously adjustable in a predetermined capacitance range in dependence on a tuning voltage.

With the first tuning section 20 a coarse tuning of the voltage controlled oscillator circuit 100 can be made, i.e. the voltage controlled oscillator circuit 100 can be adjusted to one of a plurality of frequency bands. With the second tuning section 30 a fine tuning of the voltage controlled oscillator circuit 100 can be made, i.e. the voltage controlled oscillator circuit 100 can be continuously tuned within the frequency band which is adjusted according to the configuration of the activated first capacitor elements 21 of the first tuning section 20.

Figure 3:
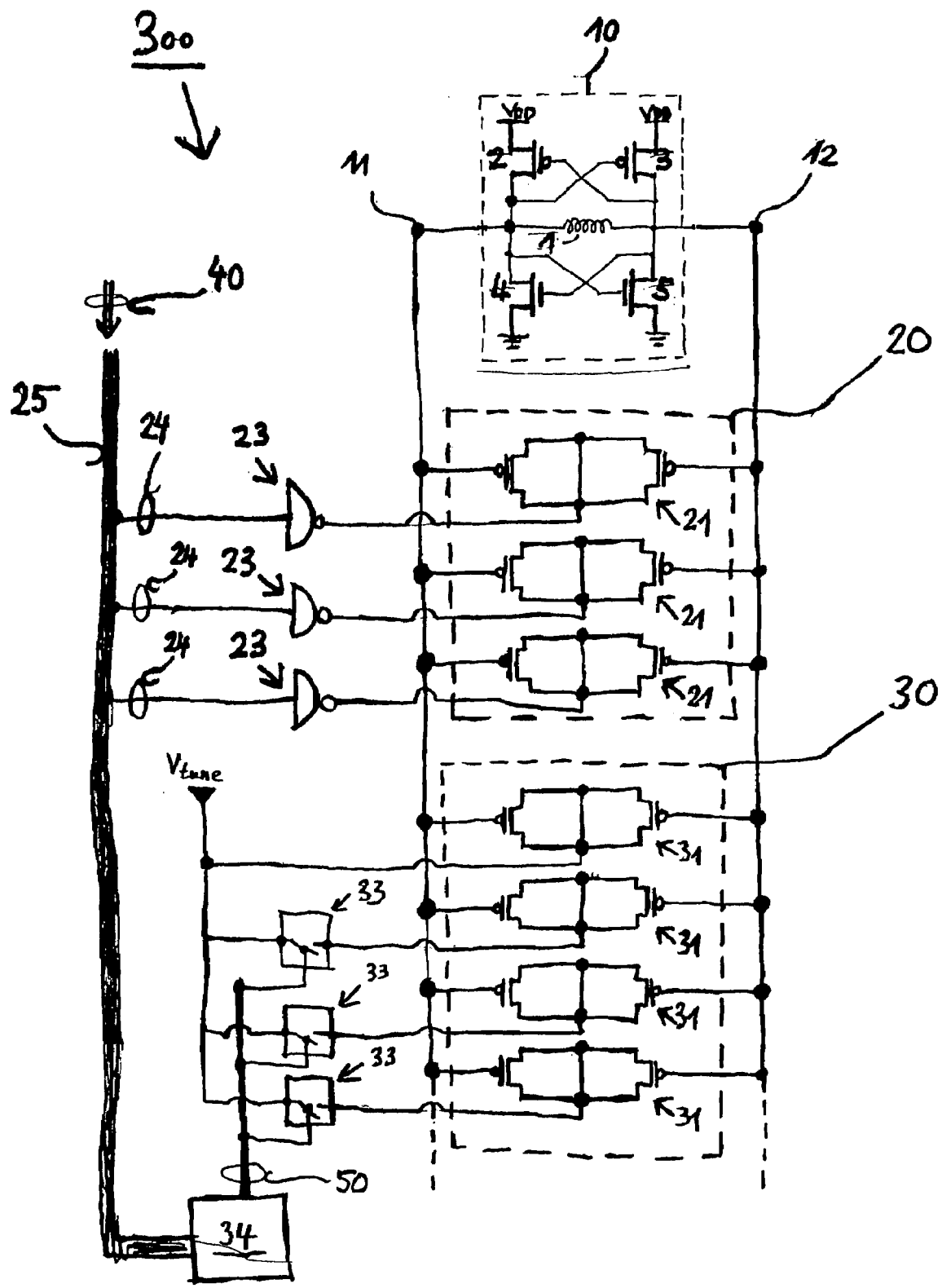
FIG. 3 shows a schematic representation of a further embodiment of a voltage controlled oscillator circuit.

As can be seen in the embodiment of FIG. 3, for example, the circuit configuration of a voltage controlled oscillator circuit 300 can be such that the tank circuit 10 is connected between a first node 11 and a second node 12, the first tuning section 20 is connected between the first node 11 and the second node 12 parallel to the tank circuit 10, and the second tuning section 30 is connected between the first node 11 and the second node 12 parallel to the tank circuit 10 and the first tuning section 20.

In the voltage controlled oscillator circuit 100 as depicted in FIG. 1, the first capacitor elements 21 of the first tuning section 20 and the second capacitor elements 31 of the second tuning section 30 are individually utilizable for the tank circuit 10. In FIG. 1 this is indicated by the dashed lines connecting the capacitor elements 21 and the capacitor elements 31 to the tank circuit 10. With the term utilizable it is meant that the circuit configuration can be changed in such a way that anyone of the capacitor elements 21 or of the capacitor 31 can be activated and the capacitance of anyone of the first capacitor elements 21 or the second capacitors can be made to contribute to the capacitance as provided by the tank circuit 10 in order to increase the total capacitance of the circuit which determines the oscillator frequency of the voltage controlled oscillator circuit 100. Thus, a maximum attainable capacitance value of each one of the first capacitor elements 21 as well as any lower capacitance value of each one of the first capacitor elements 21 can be made to add to the capacitance as provided in the tank circuit 10. Also a maximum attainable capacitance value of each one of the second capacitor elements 31 as well as any lower capacitance value of each one of the second capacitor elements 31 can be made to add to the capacitance as provided in the tank circuit 10.

According to one embodiment of the voltage controlled oscillator circuit 100 the second capacitor elements 31 can be identical or can be identical in one or more of size, structure and electrical properties. According to a further embodiment the second capacitor elements 31 can be different or can be different in one or more of size, structure and electrical properties.

The second capacitor elements 31 of the voltage controlled oscillator circuit 100 can be individually activated so that the number of activated second capacitor elements 31 can be determined. With increasing number of active or activated second capacitor elements 31 the gain of the voltage controlled oscillator circuit 100 changes. This gives the ability for compensating the change of the gain during coarse tuning of the VCO frequency or selectively changing the frequency band of a PLL of which the voltage controlled oscillator circuit 100 might be part of.

The capacitance value of each one of the second capacitor elements 31 of the voltage controlled oscillator circuit 100 is continuously adjustable in a predetermined capacitance range in dependence on a tuning voltage. According to an embodiment it can be the case that the second capacitor elements 31 are continuously adjustable by one and the same tuning voltage, i.e. the second capacitor elements 31 are connected to one and the same tuning voltage source. According to a further embodiment the second capacitor elements 31 can be continuously adjustable by more than one tuning voltages of more than one tuning voltage sources connected with the second capacitor elements 31, respectively.

According to a further embodiment each one of the first capacitor elements of the voltage controlled oscillator circuit comprises at least one voltage controlled capacitor, in particular a varactor, connected parallel to the tank circuit 10. In a further embodiment thereof two control voltages are provided wherein application of a first control voltage thereof to the varactor provides maximum capacitance contribution of the varactor to the tank circuit and application of a second control voltage thereof to the varactor provides minimum capacitance contribution of the varactor to the tank circuit. The control voltages can, for example, be applied to one of the electrodes of the varactor in order to control the voltage difference between the opposing electrodes of the varactor. In a further thereof the first capacitor elements are each comprised of a pair of two coupled varactors, wherein the pair of two varactors comprises a first varactor and a second varactor, and a gate terminal of the first varactor is coupled to the first node, a gate terminal of the second varactor is coupled to the second node, and a drain terminal of the first varactor and a drain terminal of the second varactor and coupled to each other and to a terminal for inputting the control voltages.

According to a further embodiment each one of the second capacitor elements of the voltage controlled oscillator circuit comprises at least one voltage controlled capacitor, in particular a varactor connected parallel to the tank circuit 10. In a further embodiment thereof the second capacitor elements are each comprised of a pair of two varactors.

According to a further embodiment the voltage controlled oscillator circuit comprises a plurality of control devices, each one of the control devices being connected to one of the second capacitor elements, wherein each control device comprises a first input to input the tuning voltage, a second input to input a control signal to control the state of the control device, and an output connected to the respective second capacitor element. The voltage controlled oscillator circuit may further comprise a decoder having an input to input a first digital word supplied to the first capacitor elements, and an output to output a second digital word, wherein the output of the decoder is connected to the control devices such that the output is split into a plurality of output lines each output line representing one bit position of the second digital word and each output line connected to a respective second input of one of the control devices. It can also be the case that each control device comprises a switch for leading the control voltage through to the respective second capacitor element in a closed state of the switch. Alternatively each control device comprises a voltage buffer for leading a desired fraction of the control voltage through to the respective second capacitor element in one state of the buffer. The decoder can be arranged for generating the second digital word in dependence on the first digital word wherein for each particular first digital word a predetermined second digital word is generated. The generation of second digital words in dependence on particular first digital words can be such that the variation of the VCO gain between the tuning curves becomes minimum, wherein the tuning curves represent the dependency of the oscillator frequency on the tuning voltage.

The VCO gain of a tuning curve can be understood according to one embodiment as a quantity based on or given by the difference between a maximum frequency and a minimum frequency in a particular range of the tuning voltage. According to another embodiment the VCO gain can be understood as a quantity based on or given by the derivative $\delta f/\delta V_{tune}$ at one or more values within a particular range of the tuning voltage, where f is the oscillator frequency and $V_{tune}$ is the tuning voltage.

Figure 2:
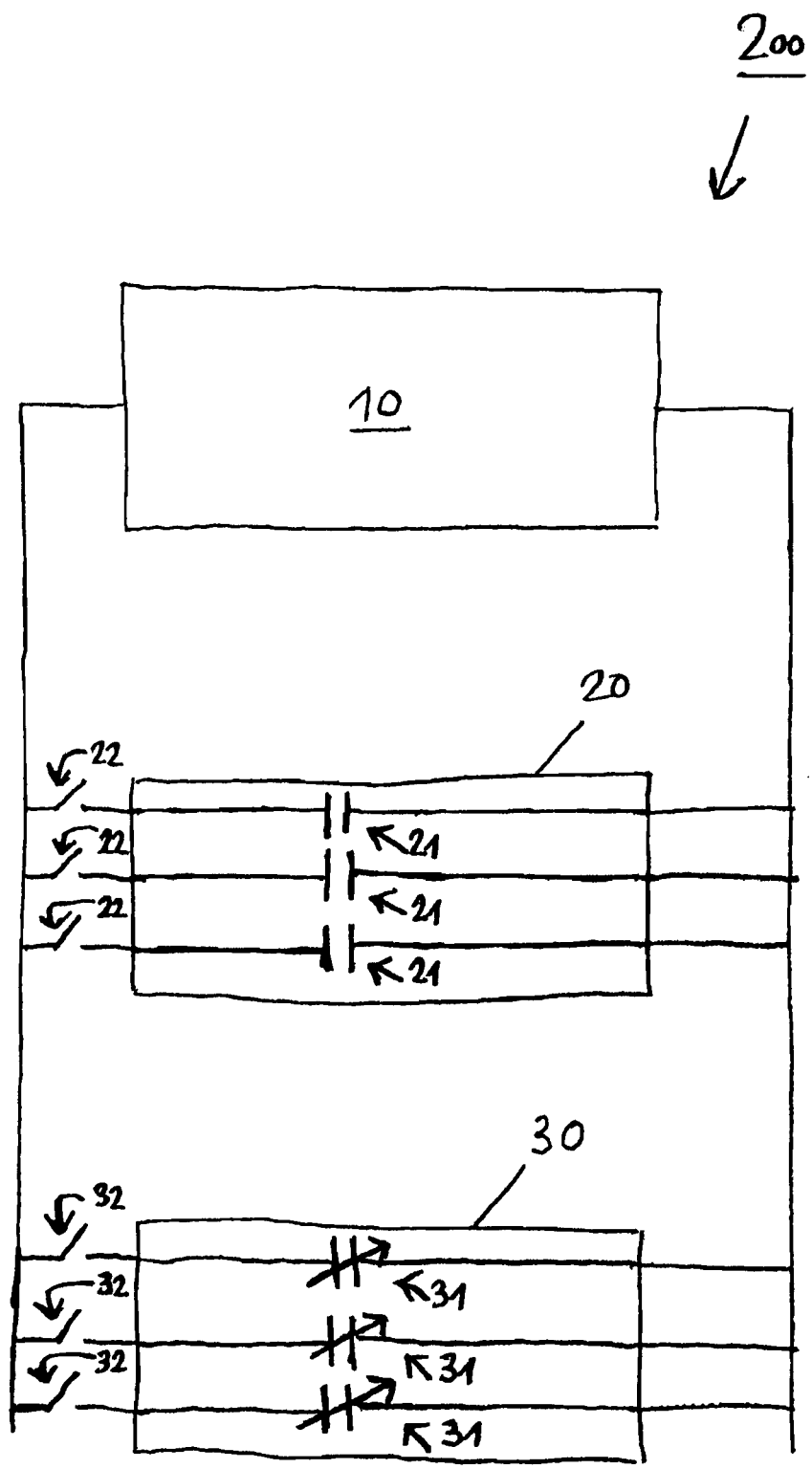
FIG. 2 shows a schematic representation of a further embodiment of a voltage controlled oscillator circuit.

Referring to FIG. 2, there is shown a schematic representation of a further embodiment of a voltage controlled oscillator circuit 200 in the form of a block diagram. In this embodiment the individual selection and activation of the first capacitors 21 is accomplished by first switches 22 which are connected between each one of the first capacitor elements 21 and the tank circuit 10, respectively. In this case anyone of the first capacitor elements 21 can be connected in parallel to the tank circuit 10, in particular to a capacitor of the tank circuit 10, by closing the respective first switch 22 and it can also be disconnected from the tank circuit 10 by opening the respective first switch 22. In the same way, the individual selection and activation of the second capacitors 31 is accomplished by second switches 32 which are connected between each one of the second capacitor elements 31 and the tank circuit 10, respectively. In this case anyone of the second capacitor elements 31 can be connected in parallel to the tank circuit 10, in particular to a capacitor of the tank circuit 10, by closing the respective second switch 32 and it can also be disconnected from the tank circuit 10 by opening the respective second switch 32.

As an alternative to the embodiment of the voltage controlled oscillator circuit 200 as depicted in FIG. 2, in a further embodiment it may also be provided that one or more of the first capacitor elements 21 and the second capacitor elements 31 are permanently connected to the tank circuit 10. Each one of the first capacitor elements 21 and the second capacitor elements 31 is connected with a respective control circuit.

Each control circuit is adapted to generate a first state in which the respective capacitor comprises a first capacitance value and a second state in which the respective capacitor comprises a second capacitance value. Thus, the capacitor will contribute either with its first capacitance value or with its second capacitance value to the capacitance of the tank circuit 10. The first capacitance value can, for example, be a maximum attainable capacitance value of the capacitor and the second capacitance value can, for example, be zero. Thus the control circuit has a similar effect as a switch as used in the embodiment of FIG. 2. A specific example of an embodiment using a control circuit will be outlined further below.

Referring to FIG. 3, there is shown a schematic circuit representation of a further embodiment of a voltage controlled oscillator circuit 300. A tank circuit 10 includes an inductor 1 connected between nodes 11 and 12. A cross-coupled pair of PMOS transistors 2 and 3 is coupled between nodes 11 and 12 and VDD, and a cross-coupled pair of NMOS transistors 4 and 5 is coupled between nodes 11 and 12 and ground. With some parasitic capacitance at nodes 11 and 12 tank circuit 10 can oscillate.

The tank circuit 10 of the voltage controlled oscillator circuit 300 is connected parallel to a first tuning section 20 and a second tuning section 30. The tank circuit 10 is connected between a first node 11 and a second node 12, the first tuning section 20 is connected between the first node 11 and the second node 12 parallel to the tank circuit 10, and the second tuning section 30 is connected between the first node 11 and the second node 12 parallel to the tank circuit 10 and the first tuning section 20.

The first tuning section 20 of the voltage controlled oscillator circuit 300 is comprised of a plurality of first capacitor elements 21 coupled between the first node 11 and the second node 12, respectively. There are shown three first capacitor elements 21 in the embodiment of FIG. 3 which is, however, not to be understood as limiting. The number of first capacitor elements 21 can be any number and is determined by the desired number of frequency bands. Each one of the first capacitor elements 21 is comprised of a pair of coupled varactors comprising a first varactor and a second varactor. A gate terminal of the first varactor is coupled to the first node 11, a gate terminal of the second varactor is coupled to the second node 12, and a drain terminal of the first varactor and a drain terminal of the second varactor are coupled to each other and to a terminal for inputting control voltages.

Each pair of varactors of the first capacitor elements 21 can be controlled digitally, i.e. by applying a logic high or a logic low to the drain terminals of the first varactor and the second varactor. The logic high and the logic low correspond to the two different control voltages. The logic high corresponds to a first control voltage of the two control voltages which is, for example, the VDD voltage and the logic low corresponds to a second control voltage which is, for example, the VSS voltage. With the application of the VDD voltage to the drain terminals of the first and second varactors, the voltage difference between the gate terminals and the respective drain terminals becomes minimum or zero. With the application of the VSS voltage to the drain terminals of the first and second varactors, the voltage difference between the gate terminals and the respective drain terminals of the first and second varactors becomes maximum. Therefore with the application of the logic high voltage or the logic low voltage, different capacitance values of the varactor pairs are obtained.

A first tuning section having three digitally controlled varactors has eight frequency bands of operation. Each varactor pair is driven by a digital inverter of a plurality of digital inverters 23. The input terminals of the digital inverters 23 are each connected to single-bit input lines 24, respectively. The single-bit input lines 24 are connected to a multi-bit input line 25 transmitting a first digital word 40 for controlling the capacitor elements 21. In the embodiment as depicted in FIG. 3 the first digital word 40 has a word length of three bits so that the multi-bit line has three bit lines. When one of the bit lines 24 carries a logic high, the respective digital inverter 23 outputs a logic low so that a ground voltage VSS is applied to the drain terminals of the first and second varactor of the respective pair of varactors resulting in a high voltage difference between the drain terminal and the gate terminal and a high capacitance value. Thus a logic "1" on a bit line 24 means an activated capacitor element 21.

The second tuning section 30 of the voltage controlled oscillator circuit 300 is comprised of a plurality of second capacitor elements 31 coupled between the first node 11 and the second node 12, respectively. There are shown four second capacitor elements 31 in the embodiment of FIG. 3 which is, however, not to be understood as limiting. The number of second capacitor elements 31 can be any number. Each one of the second capacitor elements 31 is comprised of a pair of coupled varactors comprising a first varactor and a second varactor. A gate terminal of the first varactor is coupled to the first node 11, a gate terminal of the second varactor is coupled to the second node 12, and a drain terminal of the first varactor and a drain terminal of the second varactor are coupled to each other.

In the embodiment of FIG. 3 in a first one of the second capacitor elements 31 the drain terminals are directly connected to the voltage source of the tuning voltage. In the other capacitor elements 31 the drain terminals are connected to a control device 33. In one embodiment the control device can be a switch. When the switch is closed the drain terminals of the pair of varactors are connected to the voltage source of the tuning voltage allowing tuning of the capacitor element. The tuning of the varactors occurs by tuning the potential of the drain terminals and thereby tuning the voltage difference between the gate terminal and the drain terminal of each one of the varactors of the pair of varactors.

The control devices 33 each comprise a first input connected to the voltage source of the tuning voltage, a second input to input a control voltage to the control device 33, and an output connected to the respective capacitor element 31, respectively. The second input is connected to an output of a decoder 34. The decoder 34 delivers a second digital word 50 having a word length of three bits to its output. The decoder 34 has an input for inputting the first digital word 40. In the decoder the second digital word 50 is generated in dependence on the first digital word 40. The generation of second digital words 50 in dependence on particular first digital words 40 can be such that the variation of the VCO gain between the tuning curves becomes minimum, wherein the tuning curves represent the dependency of the oscillator frequency on the tuning voltage. For this purpose the decoder 34 can be pre-configured to convert any particular first digital word 40 to a particular second digital word 50.

As already mentioned according to an embodiment the control device 33 can be a switch. In a further embodiment, however, the control device 33 can also be a voltage buffer. Such a voltage buffer may, for example, comprise a voltage divider for allowing only a desired fraction of the input tuning voltage to be delivered to the output of the control device 33 and thus to the drain terminals of the varactor pairs.

Figure 4:
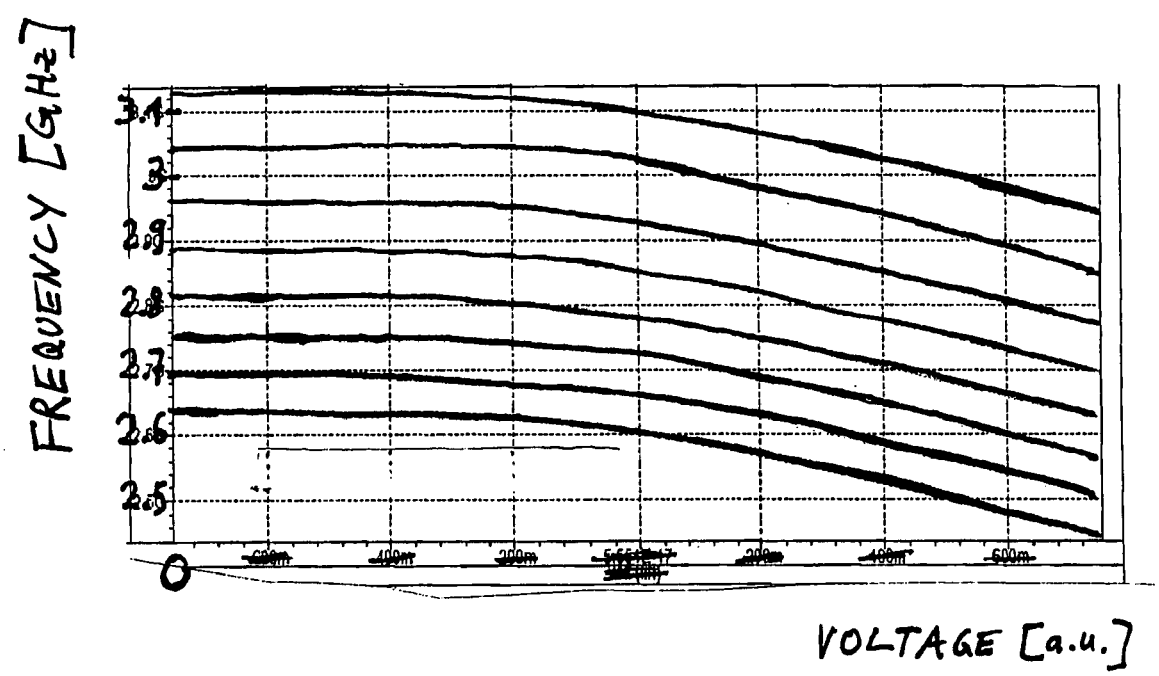
FIG. 4 shows a diagram representation of the tuning curves obtained with the embodiment of a voltage controlled oscillator circuit as depicted in FIG. 3.

Referring to FIG. 4, there is shown a diagram representation of the tuning curves which may, for example, be obtained with the embodiment of a voltage controlled oscillator circuit as depicted in FIG. 3. The diagram shows the output frequency of the voltage controlled oscillator circuit in dependence of the tuning voltage as delivered to the second capacitor elements. There are plotted 8 different tuning curves which correspond to the 8 different switching configurations of the 3 first capacitor elements ($2^3=8$). It can be seen that the selection of active second capacitor elements is such that the tuning curves have nearly equal or similar VCO gain. For the lowest tuning curve the difference between the maximum frequency (fmax) and the minimum frequency (fmin) is 190 MHz and the difference between fmax and fmin for the highest tuning curve is 189 MHz. The voltage range of the tuning curves as shown in FIG. 4 is about from 0 to 1.5 V.

Figure 5A:
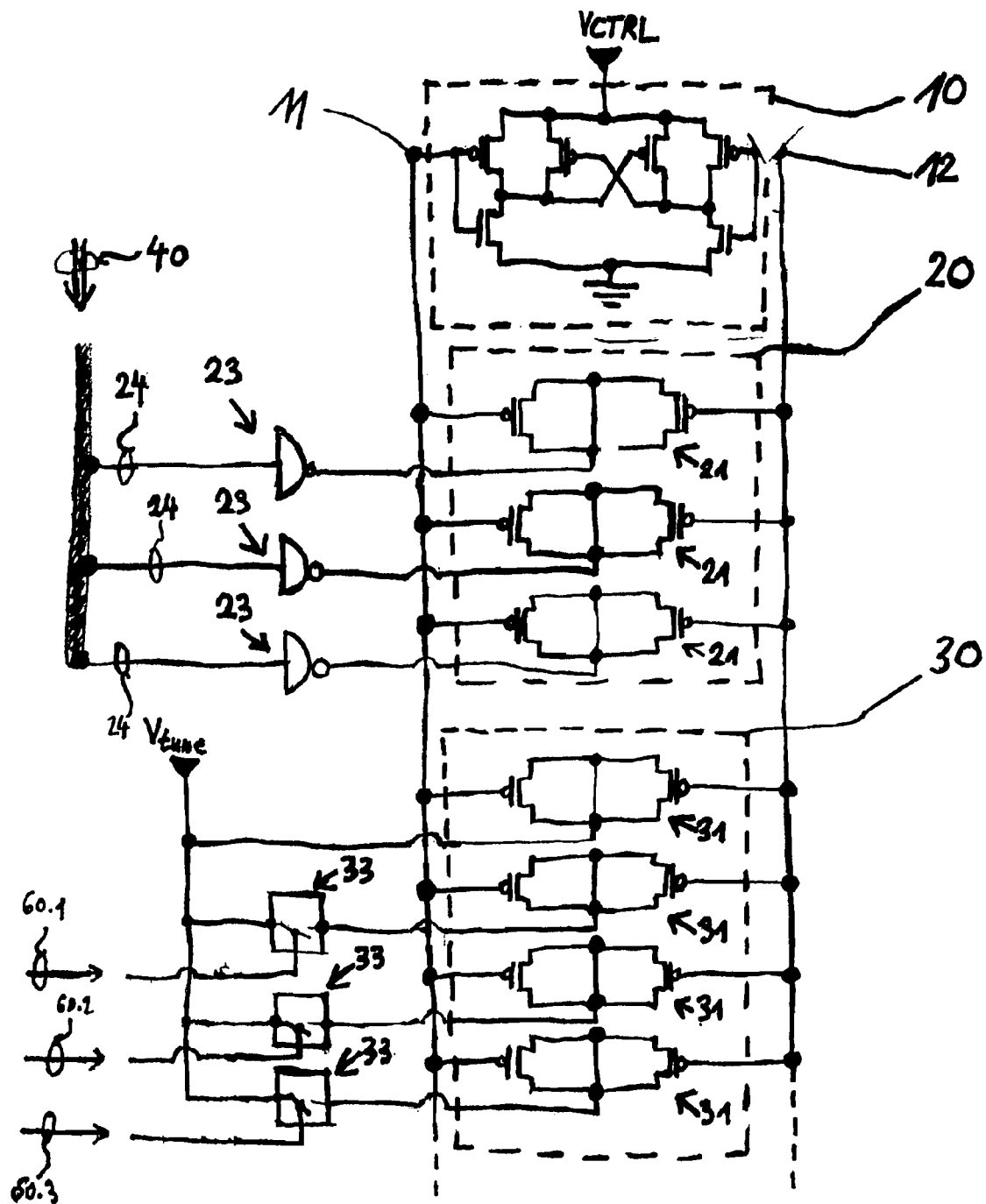
FIGS. 5a, 5b show a schematic representation of a further embodiment of a voltage controlled oscillator circuit based on a ring oscillator configuration.
Figure 5B:
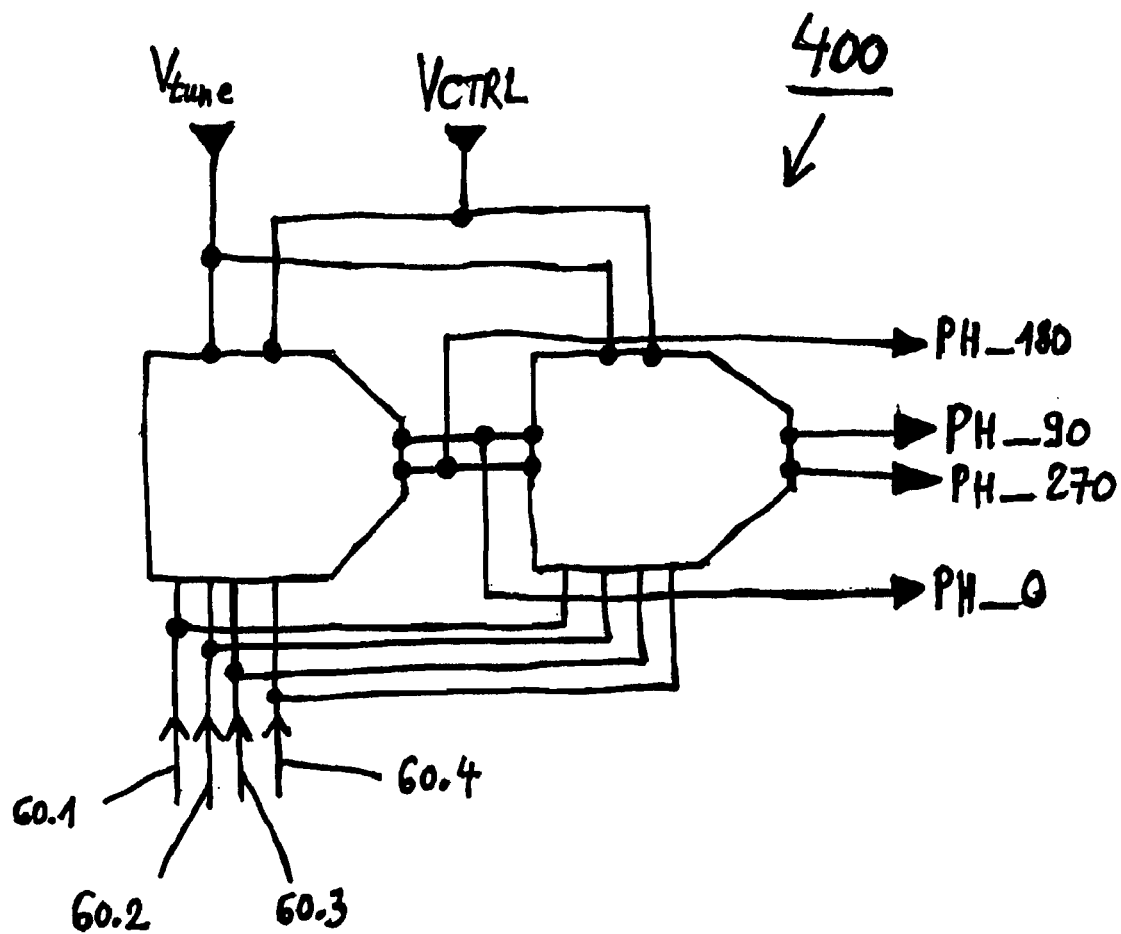

Referring to FIGS. 5a, b there is shown a schematic representation of a further embodiment of a voltage controlled oscillator circuit, which is based on a ring oscillator configuration. FIG. 5a shows one delay cell of a voltage controlled ring-oscillator circuit and FIG. 5b shows an embodiment of a ring-oscillator circuit 400 built of two of the delay cells as shown in FIG. 5a. However the ring-oscillator could also be built of a larger number of not necessarily equivalent stages. VCTRL is the control voltage of the voltage controlled oscillator circuit. The output signals PH_0, PH_90, PH_180, PH_270 are the output signals of the ring oscillator circuit which are shifted by 90° degrees to each other.

The delay cell of FIG. 5a comprises a gain stage 10, a first tuning section 20, and a second tuning section 30. The first tuning section 20 can be of the same structure as the one depicted and described in FIG. 3 and as well the second tuning section 30 can be of the same structure as the one depicted and described in FIG. 3. The controlling of the first tuning section 20 with the first digital word 40 is as well the same in FIG. 3. The controlling of the second tuning section 30, however, is different from that in FIG. 3. The circuit as depicted in FIG. 5a does not comprise a decoder and the controlling of the control devices 33 does not depend on the first digital word 40. In fact, the control devices 33 can be controlled externally and individually by inputting signals into the single-bit lines connected to the second input of the control device 33. With such a configuration it will be possible to select a particular frequency band with the first tuning section 20 and then to chose a desired tuning curve with a desired VCO gain by controlling the control devices 33, i.e. selecting any desired combination of second capacitor elements. This configuration allows, for example, to obtain a tuning curve having maximum VCO gain.

Referring to FIG. 6a, there is shown a diagram of an embodiment of a method for configuring a voltage controlled oscillator circuit. This method comprises a single step, which comprises determining for each use configuration of first capacitors a use configuration of second capacitors such that the variation of the VCO gain between the tuning curves becomes minimum, wherein the tuning curves represent the dependency of the oscillator frequency on the tuning voltage.

Referring to FIG. 6b, there is shown a diagram of an embodiment of a method for configuring a voltage controlled oscillator circuit. This method comprises a single step, which comprises determining for a particular use configuration of first capacitors a use configuration of second capacitors such that the VCO gain of the respective tuning curve becomes maximum, wherein the tuning curve represents the dependency of the oscillator frequency on the tuning voltage.

What is claimed is:

1. A voltage controlled oscillator (VCO) circuit, comprising:
a tank circuit comprising a ring oscillator circuit;
a first tuning section comprising first capacitor elements wherein each of the first capacitor elements is individually utilizable for the tank circuit, and
a second tuning section comprising second capacitor elements wherein each of the second capacitor elements is individually utilizable for the tank circuit and the capacitance of each of the second capacitor elements is continuously adjustable in a predetermined capacitance range in dependence on a tuning voltage.

2. A voltage controlled oscillator circuit, comprising:
a tank circuit comprising a ring oscillator tank circuit connected between a first node and a second node;
a first tuning section connected between the first node and the second node parallel to the tank circuit, the first tuning section comprising first capacitor elements individually utilizable for the tank circuit, wherein each of the first capacitor elements comprises a first varactor and a second varactor, and wherein a gate terminal of the first varactor is coupled to the first node, a gate terminal of the second varactor is coupled to the second node, and a drain terminal of the first varactor and a drain terminal of the second varactor are coupled to each other and are coupled to a terminal for inputting control voltages; and
a second tuning section connected between the first node and the second node parallel to the tank circuit and the first tuning section, the second tuning section comprising second capacitor elements, wherein each of the second capacitor elements is individually utilizable for the tank circuit and the capacitance of each of the second capacitor elements is continuously adjustable in a predetermined capacitance range based on a tuning voltage, and wherein each of the second capacitor elements is individually connectable to the tank circuit by a switch.

3. The voltage controlled oscillator circuit according to claim 2, wherein each one of the first capacitor elements is individually connectable to the tank circuit by a switch.

4. The voltage controlled oscillator circuit according to claim 2, wherein each one of the first capacitor elements comprises at least one varactor connected parallel to the tank circuit.

5. The voltage controlled oscillator circuit according to claim 4, wherein two control voltages are provided wherein application of a first control voltage to the first varactor or the second varactor provides maximum capacitance contribution of the varactor receiving the first control voltage to the tank circuit and application of a second control voltage to the first varactor or the second varactor provides minimum capacitance contribution of the varactor receiving the second control voltage to the tank circuit.

6. The voltage controlled oscillator circuit according to claim 2, wherein each of the second capacitor elements comprises at least one varactor connected parallel to the tank circuit.

7. The voltage controlled oscillator circuit according to claim 6, wherein each of the second capacitor elements comprise a pair of varactors.

8. The voltage controlled oscillator circuit according to claim 2, further comprising:
a plurality of control devices, each of the control devices being operably connected to one of the second capacitor elements, wherein
each of the control devices comprises a first input configured to receive the tuning voltage, a second input configured to receive a control signal to control a state of the control device, and an output connected to the respective second capacitor element.

9. The voltage controlled oscillator circuit according to claim 8, further comprising:
a decoder having an input configured to receive a first digital word which is also supplied to the first capacitor elements, and an output configured to provide a second digital word, wherein the output of the decoder is connected to the control devices such that the output is split into a plurality of output lines, each output line representing one bit position of the second digital word and each output line connected to a respective second input of one of the control devices.

10. The voltage controlled oscillator circuit according to claim 8, wherein each control device comprises a switch for providing the control voltage through to the respective second capacitor element in a closed state of the switch.

11. The voltage controlled oscillator circuit according to claim 8, wherein each control device comprises a voltage buffer configured to provide a fraction of the control voltage through to the respective second capacitor element in one state of the buffer.

12. The voltage controlled oscillator circuit according to claim 9, wherein the decoder is configured to generate the second digital word in dependence on the first digital word, wherein for each particular first digital word a predetermined second digital word is generated.

13. The voltage controlled oscillator circuit according to claim 12, wherein tuning curves represent the dependency of the oscillator frequency on the tuning voltage, and wherein
the generation of second digital words in dependence on particular first digital words is such that the variation of the VCO gain between the tuning curves becomes minimum.

14. The voltage controlled oscillator circuit according to claim 13, wherein the VCO gain of a tuning curve is based on or given by the difference between a maximum frequency and a minimum frequency in a particular range of the tuning voltage.

15. The voltage controlled oscillator circuit according to claim 13, wherein the VCO gain of a tuning curve is based on or given by the derivative $\delta f/\delta V_{tune}$ at one or more values within a particular range of the tuning voltage, where f is the oscillator frequency and $V_{tune}$ is the tuning voltage.

16. A method for configuring a voltage controlled oscillator (VCO) circuit, said voltage controlled oscillator circuit comprising a tank circuit comprising a ring oscillator tank circuit, a first tuning section comprising first capacitors individually utilizable for the tank circuit,
and a second tuning section comprising second capacitors individually utilizable for the tank circuit and each comprising a capacitance which is continuously adjustable in a predetermined capacitance range in dependence on a tuning voltage, wherein each of the second capacitors is individually connectable to the tank circuit by a switch, the method comprising:
determining for each use configuration of first capacitors a use configuration of second capacitors such that the variation of the VCO gain between tuning curves becomes minimum, wherein the tuning curves represent the dependency of the oscillator frequency on the tuning voltage.

17. The method according to claim 16, wherein
the VCO gain of a first tuning curve is based on or given by the difference between a maximum frequency and a minimum frequency in a particular range of the tuning voltage.

18. The method according to claim 16, wherein
the VCC gain of a first tuning curve is based on or given by the derivative $\delta f/\delta V_{tune}$ at one or more values within a particular range of the tuning voltage where f is the oscillator frequency and $V_{tune}$ is the tuning voltage.

19. A method for configuring a voltage controlled oscillator (VCO) circuit, said voltage controlled oscillator circuit comprising a tank circuit comprising a ring oscillator tank circuit, a first tuning section comprising first capacitors individually utilizable for the tank circuit, and a second tuning section comprising second capacitors individually utilizable for the tank circuit and each comprising a capacitance which is continuously adjustable in a predetermined capacitance range in dependence of a tuning voltage, wherein each of the second capacitors is individually connectable to the tank circuit by a switch, the method comprising:
determining for a particular use configuration of first capacitors a use configuration of second capacitors such that the VCO gain of a respective tuning curve becomes maximum, wherein the tuning curve represents the dependency of the oscillator frequency on the tuning voltage.

20. The method according to claim 19, wherein
the VCO gain of the tuning curve is based on or given by the difference between a maximum frequency and a minimum frequency in a particular range of the tuning voltage.

21. The method according to claim 19, wherein
the VCO gain of the tuning curve is based on or given by the derivative $\delta f/\delta V_{tune}$ at a particular value of the tuning voltage within a particular range of tuning voltages, where f is the oscillator frequency and $V_{tune}$ is the tuning voltage.

* * * * *